United States Patent
Cao

(10) Patent No.: US 9,905,183 B2
(45) Date of Patent: Feb. 27, 2018

(54) GATE DRIVER CIRCUIT AND DISPLAY DEVICE APPLY CIRCUIT THEREOF

(71) Applicant: Wuhan China Star Optoelectronics Technology Co., Ltd., Wuhan, Hubei (CN)

(72) Inventor: Shangcao Cao, Guangdong (CN)

(73) Assignee: Wuhan China Star Optoelectronics Technology Co., Ltd, Wuhan, Hubei (CN)

(*) Notice: Subject to any disclaimer, the term of this patent is extended or adjusted under 35 U.S.C. 154(b) by 108 days.

(21) Appl. No.: 15/000,724

(22) Filed: Jan. 19, 2016

(65) Prior Publication Data
US 2017/0124974 A1 May 4, 2017

(30) Foreign Application Priority Data
Nov. 2, 2015 (CN) .......................... 2015 1 07355979

(51) Int. Cl.
*G09G 3/36* (2006.01)
*H01L 27/12* (2006.01)
*G11C 19/28* (2006.01)

(52) U.S. Cl.
CPC ......... *G09G 3/3677* (2013.01); *G09G 3/3696* (2013.01); *G11C 19/28* (2013.01); *H01L 27/124* (2013.01); *H01L 27/1255* (2013.01); *G09G 2300/0408* (2013.01); *G09G 2300/0809* (2013.01); *G09G 2310/0202* (2013.01); *G09G 2310/0224* (2013.01); *G09G 2310/0281* (2013.01); *G09G 2310/0283* (2013.01); *G09G 2310/0286* (2013.01)

(58) Field of Classification Search
None
See application file for complete search history.

(56) References Cited

U.S. PATENT DOCUMENTS

2009/0086116 A1* 4/2009 Pak .................. G09G 3/3655
349/38
2016/0351156 A1* 12/2016 Wu .................... G11C 19/28

\* cited by examiner

*Primary Examiner* — Amr Awad
*Assistant Examiner* — Andre Matthews
(74) *Attorney, Agent, or Firm* — Andrew C. Cheng

(57) ABSTRACT

The present disclosure provides a gate driver circuit, which cascades each even-numbered stage GOA circuit; corresponding to said odd-numbered stage GOA provides an odd-numbered stage scan signal, and odd-numbered stage startup signal, an odd-numbered stage timing signal; corresponding to said even-numbered stage GOA circuit provides an even-numbered stage scan signal, an even-numbered stage startup signal, an even-numbered stage timing signal; through controlling the potential of odd-numbered stage scan signal and even-numbered stage scan signal, coordinating with odd-numbered stage startup signal and even-numbered stage startup signal with different timing, it can control odd-numbered stage GOA circuit and even-numbered stage GOA circuit to respectively carry on forward scanning or reverse scanning. The present disclosure also provides a display device applying said gate driver circuit.

8 Claims, 3 Drawing Sheets

| scanning method | odd column | even column |
|---|---|---|
| 00 | 0 | 0 |
| 01 | 0 | 1 |
| 10 | 1 | 0 |
| 11 | 1 | 1 |

FIG 2

| scanning method | VfL | VrL | VfR | VrR |
|---|---|---|---|---|
| 00 | L | H | L | H |
| 01 | L | H | H | L |
| 10 | H | L | L | H |
| 11 | H | L | H | L |

FIG 3

GATE DRIVER CIRCUIT AND DISPLAY DEVICE APPLY CIRCUIT THEREOF

BACKGROUND OF THE DISCLOSURE

1. Field of the Disclosure

The present disclosure relates to a display technical field, and in particular to a gate driver circuit and a display device including said gate driver circuit.

2. The Related Arts

The driver (namely gate driver) of present active liquid crystal display panel horizontal scan line is mainly accomplished by an external IC, integrated circuit, the external IC can control the approximate charge and discharge of each stage of horizontal scan line. However, GOA (gate driver on array) technology is namely array substrate driving technology, can use the original process of liquid crystal display panel to produce the driver circuit of horizontal scan line on the substrate around the display region, in order to alternate the external IC to accomplish the driver of horizontal scan line. GOA technology can reduce bonding process of the external IC, it has the opportunity to improve productivity and reduces production costs, and makes liquid crystal display panel more suitable for narrow border of non-border display product. The scan method of prior gate driver circuit is generally simple, which commonly carries on forward scanning or reverse scanning at the same time, it can only be progressive or interlaced scanning at the same time, therefore, it needs to improve the prior gate driver circuit, in order to achieve the diversification of the gate scan method, to meet the requirements of different display products.

SUMMARY OF THE DISCLOSURE

The technical issue to be mainly solved by the present disclosure is to improve the prior gate driver circuit, in order to achieve diversification of gate scanning method, to meet the needs of different display products.

In order to solve the above issue, a technical solution adopted by the present disclosure is:

A gate driver circuit, which includes:

a plurality of GOA circuits, wherein each of the odd-numbered stage GOA circuit cascades, each even-numbered stage GOA circuit cascades; corresponding to said odd-numbered stage GOA being used to provide signal lines of an odd-numbered stage first scan signal, an odd-numbered stage second scan signal, and odd-numbered stage startup signal, an odd-numbered stage first timing signal, an odd-numbered stage second timing signal; corresponding to said even-numbered stage GOA circuit being used to provide signal lines of an even-numbered stage first scan signal, an even-numbered stage second scan signal, an even-numbered stage startup signal, an even-numbered stage first timing signal, an even-numbered stage second timing signal;

wherein each GOA circuit includes:

a startup module, said startup module including a first scan signal terminal in order to receive a first scan signal, a second scan signal terminal in order to receive a second scan signal, a first transistor and a second transistor, wherein first terminal of said first transistor receives a first transmission signal, second terminal of said first transistor receives said first scan signal, first terminal of said second transistor receives a second transmission signal, second terminal of said second transistor receives a second scan signal, third terminals of said first transistor and said transistor are connect with a first node;

a driving module, said driving module including a first capacitor, a second capacitor, a third transistor, a fourth transistor, a fifth transistor and a sixth transistor, also including a first timing signal terminal in order to receive a first timing signal, first terminal of said third transistor being connected with said first timing signal terminal, second terminal of said third transistor being connected with said first node, third terminal of said third transistor being connected with second terminal of said fourth transistor, first terminal of said fourth transistor being connected with a second node, third terminal of said fourth transistor being connected with a high voltage input terminal to receive a high voltage signal, said second node being connected with said high voltage input terminal through said second capacitor, said second node being also connected with first terminal of said sixth transistor, second terminal of said sixth transistor being connected with a third node, third terminal of said sixth transistor being connected with said high voltage input terminal to receive said high voltage signal, said third node being connected with said first node through said first capacitor, first terminal of said fifth transistor being connected with said first node, second terminal of said fifth transistor being connected with said first timing signal terminal, third terminal of said transistor being connected with said third node;

a control module, said control module including a second timing signal terminal, a seventh transistor and a eighth transistor, said second timing signal terminal being used to provide a second timing signal, first terminal of said eighth transistor being connected with a first node, second terminal of said eighth transistor being connected with said second timing signal terminal, third terminal of said eighth transistor being connected with said second node; first terminal of said seventh transistor being connected with said second timing signal terminal, second terminal of said seventh transistor being connected with a low voltage input terminal to receive a low voltage signal, third terminal of said seventh transistor being connected with said second node.

Wherein when said gate driver circuit carrying on forward scanning, said first scan signal being low, said second scan signal being high, when said first transmission signal being low, said first transistor turning on, said first scan signal pulling down said first node to low potential, said first transistor transmitting said first scan signal to said first node; at the mean time, said seventh transistor and said eighth transistor turning on, pulling down said second node to low potential; said first timing signal being low at this time, being controlled by said first node, said fifth transistor turning on, being controlled by said second node, said fourth transistor and said sixth transistor turning on, said third node being high.

Wherein when said first transmission signal being high, said first transistor turning off, said first timing signal becoming low, said second timing signal being high, said third node outputting low voltage signal to drive a pixel unit and as a subordinate level transmission signal.

Wherein when said second transmission signal becoming low, said second transistor turning on, said first node being pulled up to high potential, said second timing signal being low, said second node becoming low, said fourth transistor and said sixth transistor turning on, said third node outputting low voltage signal to drive a pixel signal and as a subordinate level transmission signal.

Wherein when said gate driver circuit carrying on reverse scanning, said first scan signal being high, said second scan signal being low, said second transistor turning on, said first scan signal pulling down said first node to low potential, said first transistor transmitting said first scan signal to said first node; at the mean time, said seventh transistor and said eighth transistor turning on, pulling down said second node to low potential; said first timing signal being low at this time, being controlled by said first node, said fifth transistor turning on, being controlled by said second node, said fourth transistor and said sixth transistor turning on, said third node being high.

Wherein when said second transmission signal becoming high, said second transistor turning off, said first timing signal becoming low, said second timing signal being high, said third node outputting low voltage signal to drive a pixel unit and as a subordinate level transmission signal.

Wherein when said first transmission signal becoming low, said first transistor turning on, said first node being pulled up to high potential, said second timing signal being low potential, said second node becoming low, said fourth transistor and said sixth transistor turning on, said third node outputting low voltage signal to drive a pixel unit and as a subordinate level transmission signal.

Wherein said gate driver circuit controlling odd-numbered stage GOA circuit and even-numbered stage GOA circuit to simultaneously carry on forward scanning or reverse scanning through controlling potentials of odd-numbered stage scan signal and odd-numbered stage scan signal and coordinating with odd-numbered stage startup signal and even-numbered stage startup signal with different timing.

Wherein said gate driver circuit controlling odd-numbered stage GOA circuit and even-numbered stage GOA circuit to respectively carry on forward scanning or reverse scanning through controlling potentials of odd-numbered stage scan signal and odd-numbered stage scan signal and coordinating with odd-numbered stage startup signal and even-numbered stage startup signal with different timing.

In order to solve above technical issue, the other technical solution adopted by the present disclosure is: to provide a display device, said display device includes any one of gate driver circuits described above.

The benefit effect of present disclosure is: to distinguish to the situation of prior art, the gate driver circuit provided by the present disclosure to cascade each of the odd-numbered stage GOA circuit, to cascade each even-numbered stage GOA circuit; corresponding to said odd-numbered stage GOA provides an odd-numbered stage scan signal, and odd-numbered stage startup signal, an odd-numbered stage timing signal; corresponding to said even-numbered stage GOA circuit provides an even-numbered stage scan signal, an even-numbered stage startup signal, an even-numbered stage timing signal; through controlling the potential of odd-numbered stage scan signal and even-numbered stage scan signal, coordinating with odd-numbered stage startup signal and even-numbered stage startup signal with different timing, it can control odd-numbered stage GOA circuit and even-numbered stage GOA circuit to respectively carry on forward scanning or reverse scanning, to achieve diversification of gate scanning method, improve the display quality, to meet the needs of different display products.

BRIEF DESCRIPTION OF THE DRAWINGS

FIG. 2 is a schematic diagram of different scanning method of a preferred embodiment of a gate driver circuit of the present disclosure;

FIG. 3 is a schematic diagram of different scanning method corresponding to the control signal in FIG. 2;

DETAILED DESCRIPTION OF THE PREFERRED EMBODIMENTS

Following combines the drawings and embodiments to describe the present disclosure in detail.

Refer to FIGS. 1-5, FIG. 1 is a structure schematic diagram of a gate driver circuit 100 which is applied to a liquid crystal display device 200. Left and right sides of apture area, AA, of the liquid crystal display device 200 are provided a GOA circuit. In the present embodiment, left side GOA circuit is odd-numbered stage GOA circuit, right side GOA circuit is even-numbered stage GOA circuit.

The gate driver circuit 100 of the present disclosure includes a plurality GOA circuits, wherein each odd-numbered stage GOA circuit cascades, each even-numbered stage GOA circuit cascades. Said gate driver circuit 100 also includes signal lines corresponding to said odd-numbered stage GOA provides an odd-numbered stage scan signal, and odd-numbered stage startup signal, an odd-numbered stage timing signal; signal lines corresponding to said even-numbered stage GOA circuit provides an even-numbered stage scan signal, an even-numbered stage startup signal, an even-numbered stage timing signal.

Wherein said odd-numbered GOA circuit is controlled by a scan signal VfL, a scan signal VrL to carry on forward and reverse scanning.

Wherein said even-numbered GOA circuit is controlled by a scan signal VfR, a scan signal VrR to carry on forward and reverse scanning.

Figure 1:
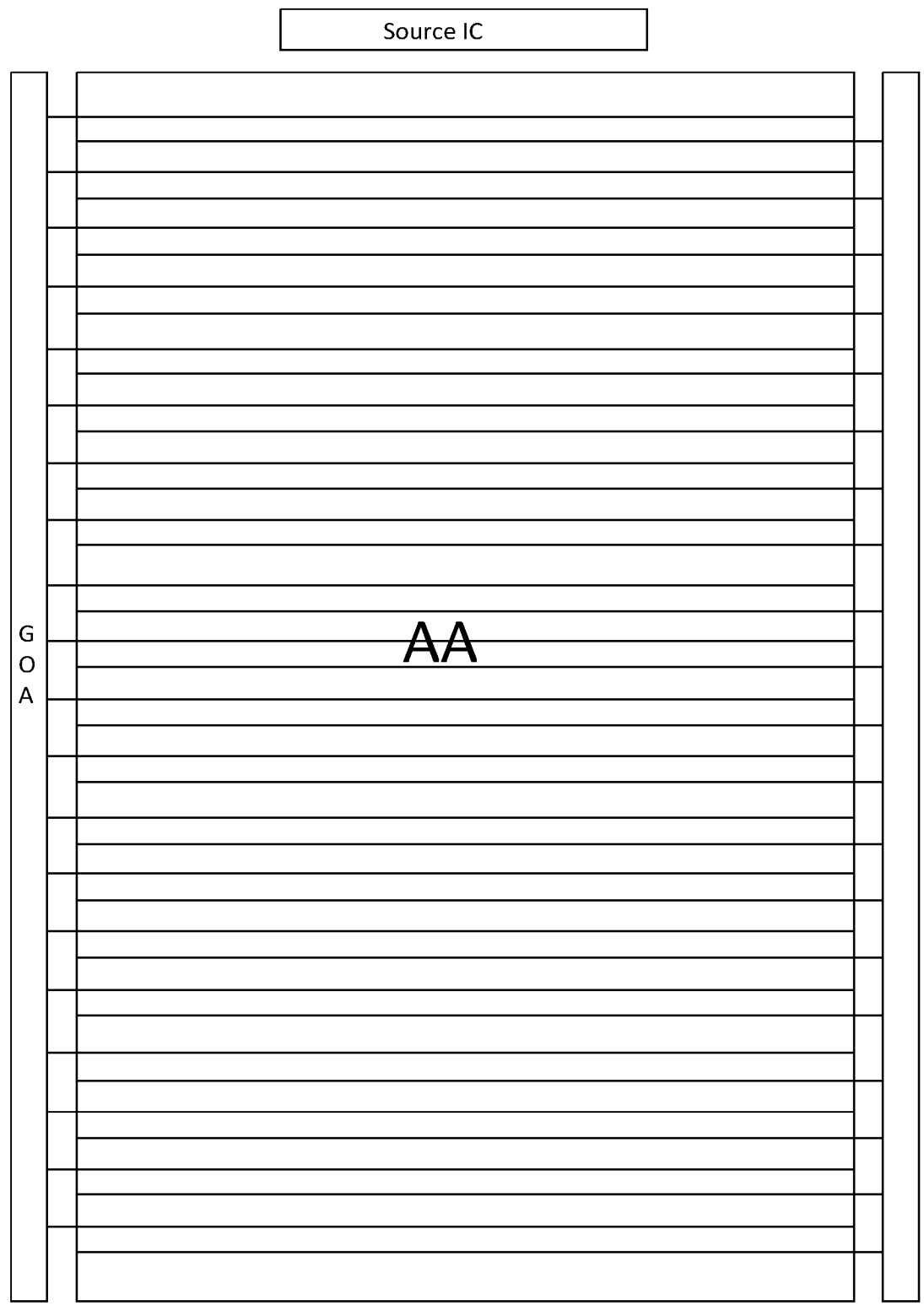
FIG. 1 is a structure schematic diagram of a preferred embodiment of a gate driver circuit which is applied to a liquid crystal display device of the present disclosure.
Figure 4:
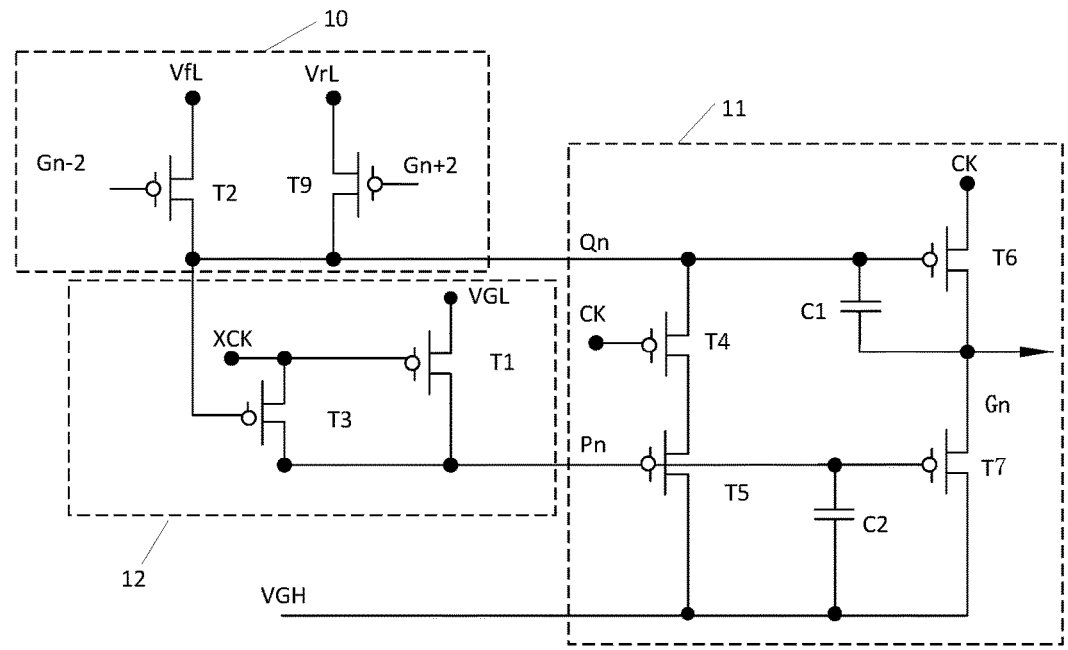
FIG. 4 is a circuit diagram of a preferred embodiment of a gate driver circuit of the present disclosure.
Figure 5:
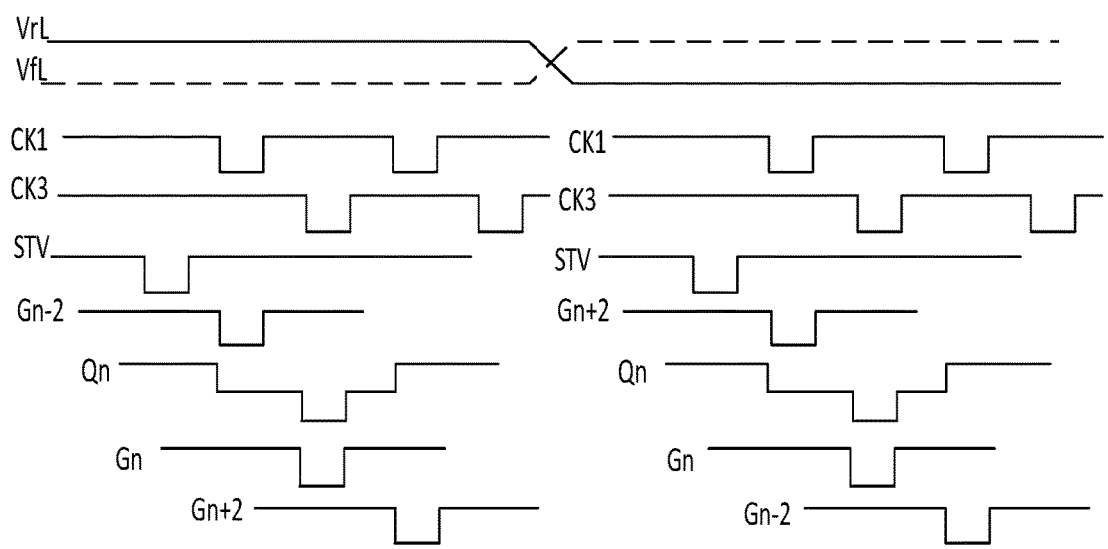
FIG. 5 is a timing chart of a preferred embodiment of a gate driver circuit of the present disclosure.

As shown in FIG. 4, each stage of GOA circuit includes a startup module 10, a driving module 11 and a control module 12.

Said startup module 10 includes a scan signal terminal VfL to receive the scan signal VfL, a scan signal terminal VrL to receive a scan signal VrL, a transistor T2 and a transistor T9. Wherein first terminal of said transistor T2 receives a transmission signal Gn−2 from (n−2)th stage GOA circuit, second terminal of said transistor T2 receives said scan signal VfL, first terminal of said transistor T9 receives a transmission signal Gn+2 from (n+2)th stage GOA circuit, second terminal of said transistor T9 receives said scan signal VrL. Third terminals of said transistor T2 and said transistor T9 are connected with a first node Qn.

Said driving module 11 includes a capacitor C1, a capacitor C2, a transistor T4, a transistor T5, a transistor T6 and a transistor T7, also includes a timing signal terminal CK to receives a timing signal CK3. First terminal of said transistor T4 is connected with said timing signal terminal CK, second terminal of said transistor T4 is connected with a first node Qn, third terminal of said transistor T4 is connected with second terminal of said transistor T5. First terminal of said transistor T5 is connected with a second node Pn, third terminal of said transistor T5 is connected with a high voltage input terminal VGH. Said second node Pn is connected with said high voltage input terminal VGH through said capacitor C2. Said second node Pn is also connected with first terminal of said transistor T7, second terminal of said transistor T7 is connected with third node Gn, third terminal of said transistor T7 is connected with said high voltage input terminal VGH. Said third node Gn is connected with said first node Qn through said capacitor C1. First terminal of said transistor T6 is connected with said first node Qn, second terminal of said transistor T6 is connected with said timing signal terminal CK, third terminal of said transistor T6 is connected with said third node Gn.

Said control module 12 includes a timing signal terminal XCK, a transistor T1, a transistor T3 and a low voltage input terminal VGL. Said timing signal terminal XCK is used to provide a timing signal CK1. First terminal of said transistor T3 is connected with said first node Qn, second terminal of said transistor T3 is connected with said timing signal XCK, third terminal of said transistor T3 is connected with said second node Pn. First terminal of said transistor T1 is connected with said timing signal terminal XCK, second terminal of said transistor T1 is connected with said low voltage input terminal VGL, third terminal of said transistor T1 is connected with said second node Pn.

The specific process of carrying on forward scanning of odd-numbered stage GOA circuit of the gate driver circuit 100 of the present disclosure is: said scan signal VfL is low, said scan signal VrL is high, Nth stage GOA circuit receives a transmission signal Gn−2 from (n−2)th stage GOA circuit, when the transmission signal Gn−2 of (N−2)th stage GOA circuit is low, said transistor T2 turns on, said scan signal VfL pulls down said first node Qn to low potential, said transistor T2 transmits said scan signal VfL to said first node Qn at this time; at the mean time, said transistor T3 and said transistor T1 turn on, to pull down said second node Pn to low potential; said timing signal CK3 is high at this time, said transistor T6 controlled by said first node Qn turns on, said transistor T5 and said transistor T7 controlled by said second node Pn turns on, said scan signal Gn is high. Next, said transmission signal Gn−2 of (N−2)th stage GOA circuit becomes high, said transistor T2 turns off, said timing signal CK3 becomes low, said timing signal CK1 is high, said third node Gn output low voltage signal to drive AA region pixel unit as a transmission signal of a subordinate (Gn+2). Said transistor T3 turns on, said second node Pn becomes high through XCK, said transistor T5 and said transistor T7 turns off, said first node Qn keeps high potential through said capacitor C1 to ensure that said third node Gn keeps on to output low voltage signal. Next, Gn+2 becomes low, said transistor T9 turns on, said first node Qn is pulled up to high potential, said timing signal CK1 is low, said second node Pn becomes low, said transistor T5 and said transistor T7 turns on, said third node Gn is now. Then said timing signal CK3 is low, said transistor T5 turns on, said first node Qn is pulled up to high potential, and said first node Qn keeps high potential in the remaining time of one frame, said second node Pn keeps low.

The specific process of odd-numbered stage GOA circuit of the gate driver circuit 100 of the present disclosure is: said scan signal VfL is high, said scan signal VrL is low, Nth stage GOA circuit receives said transmission signal Gn+2 from (N+2)th stage GOA circuit, when said transmission signal Gn+2 of (N+2)th stage GOA circuit is low, said transistor T9 turns on, said scan signal VrL pulls down said first node Qn to low potential, said transistor T9 transmits said scan signal VrL to said first node Qn at this time; at the mean time, said transistor T3 and said transistor T1 turns on, to pull down said third node Pn to low potential; said timing signal CK3 is high at this time, being controlled by said first node Qn, said transistor T6 turns on, being controlled by said second node Pn, said transistor T5 and said transistor T7 turns on, said scan signal Gn is high. Next, said transmission signal Gn+2 of (N+2)th stage GOA circuit becomes high, said transistor T9 turns off, said timing signal CK3 becomes low, said timing signal CK1 is high, said third node Gn outputs low voltage signal to drive AA region pixel unit as a subordinate (Gn−2) transmission signal. Said transistor T3 turns on, second node Pn becomes high through XCK, said transistor T5 and said transistor T7 turns off, said first node Qn keeps high potential through said capacitor C1 to ensure said third node Gn to keep on outputting low voltage signal. Next, Gn−2 becomes low, said transistor T9 turns on, said first node Qn is pulled up to high potential, said timing signal CK1 is low, said second node Pn becomes low, said transistor T5 and said transistor T7 turns on, said third node Gn is low. Then said timing signal CK3 is low, said transistor T5 turns on, said first node Qn is pulled to high potential, and said first node Qn keeps high potential in remaining time of one frame, said second node Pn keeps low.

Refer to FIGS. 1-5, the gate driver circuit 100 of the present disclosure can simultaneously carry on forward scanning and reverse scanning of odd-numbered stage GOA circuit and even-numbered stage GOA circuit, wherein table 2 shows four kinds of scan mode, 00 represents odd and even columns carry on forward scanning, 01 represents odd column carrying on forward scanning, even column carrying on reverse scanning; 11 represents odd and even columns carry on reverse scanning, 10 represents odd column carry on reverse scanning even column carry on forward scanning. Table 3 is the required potential of control signal to achieve the above method.

Details as follows:

Corresponding to said scanning method 11 in FIG. 3, said odd-numbered stage GOA circuit reverse scanning and said even-numbered stage GOA circuit reverse scanning are simultaneously carried on. Specifically, said scan signal VfL and said scan signal VfR are high, said scan signal VrL and said scan signal VrR are low; when a frame scanning begins, to provide a startup signal STV1 to the gate of said transistor T2 of said first stage GOA circuit, to provide a startup signal STV2 to the gate of said transistor T2 of said second stage GOA circuit at the same time (the timing is same as STV1, but output from IC, to be marked as STV in FIG. 5).

Corresponding to said scanning method 00 in FIG. 3, said odd-numbered stage GOA circuit forward scanning and said even-numbered stage GOA circuit forward scanning are simultaneously carried on. Specifically, said scan signal VfL and said scan signal VfR are low, said scan signal VrL and said scan signal VrR are high; when a frame scanning begins, to provide a startup signal STV2 to the gate of said transistor T9 of said last second stage GOA circuit, to provide a startup signal STV1 to the gate of said transistor T9 of said last stage GOA circuit.

Corresponding to said scanning method 10 in FIG. 3, said odd-numbered stage GOA circuit reverse scanning and said even-numbered stage GOA circuit forward scanning are simultaneously carried on. Specifically, said scan signal VfL and said scan signal VrR are high, said scan signal VrL and said scan signal VfR are low; when a frame scanning begins, to provide a startup signal STV1 to the gate of said transistor T2 of said first stage GOA circuit, to provide a startup signal STV2 to the gate of said transistor T9 of said last stage GOA circuit.

Corresponding to said scanning method 01 in FIG. 3, said odd-numbered stage GOA circuit forward scanning and said even-numbered stage GOA circuit reverse scanning are simultaneously carried on. Specifically, said scan signal VfL and said scan signal VrR are low, said scan signal VrL and said scan signal VfR are high; when a frame scanning begins, to provide a startup signal STV2 to the gate of said transistor T9 of said last second stage GOA circuit, to provide a startup signal STV1 to the gate of said transistor T2 of said second stage GOA circuit.

In the present embodiment, the gate driver circuit of the present disclosure can be respectively carried on forward scanning or reverse scanning of odd-numbered GOA circuit and even-numbered stage GOA circuit, similar to above process, there is no more description. In the above embodiment, the transistors of the gate driver circuit of the present disclosure are described as a P-channel FET, first terminal of the transistor corresponds to the gate of FET, second terminal of the transistor corresponds to the drain of FET, third terminal of the transistor corresponds to the source of FET. It should be realized that the transistor of the gate driver circuit of the present disclosure could also choose other types of FET.

In summary, the gate driver circuit 100 of the present disclosure cascades each odd-numbered stage GOA circuit, cascades each even-numbered stage GOA circuit; corresponding to said odd-numbered stage GOA provides an odd-numbered stage scan signal, and odd-numbered stage startup signal, an odd-numbered stage timing signal; corresponding to said even-numbered stage GOA circuit provides an even-numbered stage scan signal, an even-numbered stage startup signal, an even-numbered stage timing signal; through controlling the potential of odd-numbered stage scan signal and even-numbered stage scan signal, coordinating with odd-numbered stage startup signal and even-numbered stage startup signal with different timing, it can control odd-numbered stage GOA circuit and even-numbered stage GOA circuit to respectively carry on forward scanning or reverse scanning, to achieve diversification of gate scanning method, improve the display quality, to meet the needs of different display products.

The preferred embodiments according to the present disclosure are mentioned above, which cannot be used to define the scope of the right of the present disclosure. Those variations of equivalent structure or equivalent process according to the present specification and the drawings or directly or indirectly applied in other areas of technology are considered encompassed in the scope of protection defined by the claims of the present disclosure.

What is claimed is:

1. A gate driver circuit, wherein it includes:
    a plurality of GOA circuits, wherein each of the odd-numbered stage GOA circuit cascades, each even-numbered stage GOA circuit cascades; corresponding to said odd-numbered stage GOA being used to provide signal lines of an odd-numbered stage first scan signal, an odd-numbered stage second scan signal, and odd-numbered stage startup signal, an odd-numbered stage first timing signal, an odd-numbered stage second timing signal; corresponding to said even-numbered stage GOA circuit being used to provide signal lines of an even-numbered stage first scan signal, an even-numbered stage second scan signal, an even-numbered stage startup signal, an even-numbered stage first timing signal, an even-numbered stage second timing signal;
    wherein each GOA circuit includes:
    a startup module, said startup module including a first scan signal terminal in order to receive a first scan signal, a second scan signal terminal in order to receive a second scan signal, a first transistor and a second transistor, wherein first terminal of said first transistor receives a first transmission signal, second terminal of said first transistor receives said first scan signal, first terminal of said second transistor receives a second transmission signal, second terminal of said second transistor receives a second scan signal, third terminals of said first transistor and said transistor are connect with a first node;
    a driving module, said driving module including a first capacitor, a second capacitor, a third transistor, a fourth transistor, a fifth transistor and a sixth transistor, also including a first timing signal terminal in order to receive a first timing signal, first terminal of said third transistor being connected with said first timing signal terminal, second terminal of said third transistor being connected with said first node, third terminal of said third transistor being connected with second terminal of said fourth transistor, first terminal of said fourth transistor being connected with a second node, third terminal of said fourth transistor being connected with a high voltage input terminal to receive a high voltage signal, said second node being connected with said high voltage input terminal through said second capacitor, said second node being also connected with
    first terminal of said sixth transistor, second terminal of said sixth transistor being connected with a third node, third terminal of said sixth transistor being connected with said high voltage input terminal to receive said high voltage signal, said third node being connected with said first node through said first capacitor, first terminal of said fifth transistor being connected with said first node, second terminal of said fifth transistor being connected with said first timing signal terminal, third terminal of said transistor being connected with said third node;
    a control module, said control module including a second timing signal terminal, a seventh transistor and a eighth transistor, said second timing signal terminal being used to provide a second timing signal, first terminal of said eighth transistor being connected with a first node, second terminal of said eighth transistor being connected with said second timing signal terminal, third terminal of said eighth transistor being connected with said second node; first terminal of said seventh transistor being connected with said second timing signal terminal, second terminal of said seventh transistor being connected with a low voltage input terminal to receive a low voltage signal, third terminal of said seventh transistor being connected with said second node; when said gate driver circuit carrying on forward scanning, said first scan signal being low, said second scan signal being high, when said first transmission signal being low, said first transistor turning on, said first scan signal pulling down said first node to low potential, said first transistor transmitting said first scan signal to said first node; while said seventh transistor and said eighth transistor turning on, pulling down said second node to low potential; said first timing signal being low at this time, being controlled by said first node, said fifth transistor turning on, being controlled by said second node, said fourth transistor and said sixth transistor turning on, said third node being high; when said gate driver circuit carrying on reverse scanning, said first scan signal being high, said second scan signal being low, said second transistor turning on, said first scan signal pulling down said first node to low potential, said first transistor transmitting said first scan signal to said first node; while said seventh transistor and said eighth transistor turning on, pulling down said second node to low potential; said first timing signal being low at this time, being controlled by said first node, said fifth transistor turning on, being controlled by said second node, said fourth transistor and said sixth transistor turning on, said third node being high.

2. The gate driver circuit as claimed in claim 1, the characteristic of which is: when said first transmission signal being high, said first transistor turning off, said first timing signal becoming low, said second timing signal being high, said third node outputting low voltage signal to drive a pixel unit and as a subordinate level transmission signal.

3. The gate driver circuit as claimed in claim 2, the characteristic of which is: when said second transmission signal becoming low, said second transistor turning on, said first node being pulled up to high potential, said second timing signal being low, said second node becoming low, said fourth transistor and said sixth transistor turning on, said third node outputting low voltage signal to drive a pixel signal and as a subordinate level transmission signal.

4. The gate driver circuit as claimed in claim 1, the characteristic of which is: when said second transmission signal becoming high, said second transistor turning off, said first timing signal becoming low, said second timing signal being high, said third node outputting low voltage signal to drive a pixel unit and as a subordinate level transmission signal.

5. The gate driver circuit as claimed in claim 4, the characteristic of which is: when said first transmission signal becoming low, said first transistor turning on, said first node being pulled up to high potential, said second timing signal being low potential, said second node becoming low, said fourth transistor and said sixth transistor turning on, said third node outputting low voltage signal to drive a pixel unit and as a subordinate level transmission signal.

6. The gate driver circuit as claimed in claim 1, the characteristic of which is: said gate driver circuit controlling odd-numbered stage GOA circuit and even-numbered stage GOA circuit to simultaneously carry on forward scanning or reverse scanning through controlling potentials of odd-numbered stage scan signal and odd-numbered stage scan signal and coordinating with odd-numbered stage startup signal and even-numbered stage startup signal with different timing.

7. The gate driver circuit as claimed in claim 1, the characteristic of which is: said gate driver circuit controlling odd-numbered stage GOA circuit and even-numbered stage GOA circuit to respectively carry on forward scanning or reverse scanning through controlling potentials of odd-numbered stage scan signal and odd-numbered stage scan signal and coordinating with odd-numbered stage startup signal and even-numbered stage startup signal with different timing.

8. A display device, the characteristic of which is said display device including said gate driver circuit as claimed in claim 1.

\* \* \* \* \*